United States Patent
Ding

(10) Patent No.: US 8,878,316 B2
(45) Date of Patent: Nov. 4, 2014

(54) CAP SIDE BONDING STRUCTURE FOR BACKSIDE ABSOLUTE PRESSURE SENSORS

(71) Applicant: Continental Automotive Systems, Inc., Auburn Hills, MI (US)

(72) Inventor: Xiaoyi Ding, Lake Zurich, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 13/774,423

(22) Filed: Feb. 22, 2013

(65) Prior Publication Data

US 2014/0239424 A1 Aug. 28, 2014

(51) Int. Cl.
*H01L 29/82* (2006.01)
*B81B 3/00* (2006.01)

(52) U.S. Cl.
CPC .................. *B81B 3/0018* (2013.01)
USPC .............. 257/419; 257/415; 438/51

(58) Field of Classification Search
USPC .......... 257/415, 419; 438/50, 51, 53
See application file for complete search history.

(56) References Cited

U.S. PATENT DOCUMENTS

| | | | |
|---|---|---|---|
| 6,555,901 B1 * | 4/2003 | Yoshihara et al. | 257/684 |
| 6,655,216 B1 * | 12/2003 | Aizawa | 73/715 |
| 7,998,777 B1 * | 8/2011 | Gamage et al. | 438/53 |
| 2007/0052046 A1 * | 3/2007 | Chu et al. | 257/415 |
| 2009/0026561 A1 * | 1/2009 | Reichenbach et al. | 257/416 |
| 2012/0154918 A1 * | 6/2012 | Murayama et al. | 359/601 |

* cited by examiner

*Primary Examiner* — Phuc Dang

(57) ABSTRACT

A pressure sensor includes a pressure sensing element having a diaphragm, a cavity, and bridge circuitry connected to the diaphragm. A top surface is formed as part of the pressure sensing element such that at least a portion of the top surface is part of the diaphragm, and the plurality of piezoresistors are located on the top surface. A cap is bonded to the top surface through the use of a plurality of layers. One of the layers is a silicon dioxide layer, another layer is a silicon nitride layer, another layer is an oxide layer, and another of the layers is a polysilicon layer. The plurality of layers provides proper bonding between the cap and the top surface of the pressure sensing element.

18 Claims, 1 Drawing Sheet

CAP SIDE BONDING STRUCTURE FOR BACKSIDE ABSOLUTE PRESSURE SENSORS

FIELD OF THE INVENTION

Embodiments of the invention relate to a microelectromechanical system (MEMS) pressure sensor having an additional bonding layer used for securing a cap to a pressure sensing element, where the cap is part of an absolute pressure sensor.

BACKGROUND OF THE INVENTION

MEMS pressure sensors are generally known and widely used. One type of pressure sensor is an absolute pressure sensor which includes a pressure sensing element made of silicon which is anodically bonded to a glass pedestal to form a reference vacuum. The pressure sensing element includes four piezoresistors connected into what is known as a "Wheatstone Bridge" configuration, which are used for detecting changes in pressure.

Many absolute pressure sensors are used in applications in which the sensors are exposed to a harsh media. For such applications, the front side sensing by a traditional absolute pressure sensor cannot survive in the harsh media. It requires another type of absolute pressure sensor, such as a backside absolute (BSA) pressure sensor, which is resistant to exposure to harsh media. One typical BSA pressure sensor includes a top cap to enclose a reference vacuum, and expose the backside of the sensor to media.

However, current designs for the BSA pressure sensors are subject to structural failures. The bonding between the cap and the pressure sensing element is not always robust enough to maintain the hermetic bonding between the cap and the pressure sensing element.

One type of approach to bond the cap to the pressure sensing element is to use bonding films, such as a layer of polysilicon and a layer of silicon oxide in between the cap glass and the pressure sensing element. A problem that exists with this approach is output instability due to mobile ions. The cap glass has $Na^+$ ions which, along with contaminated ions, may migrate to the silicon oxide layer. Amorphous silicon oxide has many open channels, which allow for movement of $Na^+$ ions. Furthermore, when in operation, there exist strong electric fields in the silicon oxide and silicon surfaces that drive the ions to move, causing a change in the output of the pressure sensor over time, or output instability. The effect of output instability is more pronounced at high temperatures.

An attempt to overcome the output instability due to the movement of mobile ions as mentioned above is to incorporate a layer of silicon nitride film ($Si_3N_4$ deposited by low pressure chemical vapor deposition technique) in between polysilicon and silicon dioxide. Silicon nitride has proven to be an efficient dielectric layer to block mobile ions from getting into the silicon oxide and silicon surface. However, the use of silicon nitride presents other issues. $Si_3N_4$ film naturally has poor adhesion to polysilicon film. This causes integrity issues resulting from weak cap bond strength due to poor adhesion between the bonding films, such as polysilicon and silicon nitride. Some mechanical or environmental disturbance may cause interfacial failure at the interface between the silicon nitride and the polysilicon, or moisture and/or air diffusing in through the interface causing a change in the vacuum level over time. Maintaining a robust silicon nitride film is important to device performance. The type of failure which results is a failure at the interface between the silicon nitride and the polysilicon during a die shear test, or interfacial failure.

Additionally, in order for the silicon nitride to provide robust passivation, the silicon nitride must have a thickness of greater than 0.1 µm. The maximum deposition thickness of the $Si_3N_4$ film is typically less than 0.2 µm because of the high tensile stresses (the silicon nitride cracks when the thickness is greater than 0.2 µm). Some dry etching steps during wafer fabrication may etch away more than 0.1 µm, producing a layer of silicon nitride with a residual thickness of less than 0.1 µm. This degradation of the silicon nitride film during the wafer fabrication process reduces the ability of the layer of silicon nitride to block mobile ions from reaching the silicon oxide layer.

Accordingly, there exists a need for a material that provides proper bonding strength between the cap and the pressure sensing element, and protects $Si_3N_4$ film from over-etching during the fabrication process.

SUMMARY OF THE INVENTION

In some embodiments, a pressure sensor includes a pressure sensing element having a diaphragm, a cavity located under the diaphragm, and bridge circuitry doped to the top side of the diaphragm. The bridge circuitry is used to sense pressure in the cavity. A top surface is formed as part of the pressure sensing element such that at least a portion of the top surface is also part of the diaphragm. The bridge circuitry is located on the part of the top surface that is part of the diaphragm. The pressure sensing element also includes a plurality of inner surfaces which terminate into a backside surface, such that the plurality of inner surfaces and backside surface form at least part of the cavity. The pressure sensor also includes a bonding mechanism made of a plurality of thin films. The first layer of the bonding mechanism is formed on the top surface of the pressure sensing element, a second layer is deposited on the first layer, a third layer is deposited on the second layer, and a fourth layer is deposited on the third layer.

In one embodiment, the first layer is a silicon dioxide layer, the second layer is a silicon nitride layer, the third layer is an oxide layer, and the fourth layer is a polysilicon layer. The thickness of the third layer made of oxide is less than 2.0 µm, but it is within the scope of the invention that greater or less thicknesses may be used.

The pressure sensor further includes a cap having a top and bottom surface. The cap has a second cavity etched as part of the bottom surface of the cap. The cap is bonded to the fourth layer of the bonding mechanism such that the second cavity of cap houses the top side of the diaphragm in at least partial vacuum. The cap may be made of a borosilicate glass, silicon, or other suitable materials.

The present invention uses the bonding mechanism made of the four layers of films to form a top side vacuum reference in the second cavity for backside absolute pressure sensor applications. As mentioned above, one of the layers is an oxide layer between polysilicon and silicon nitride films. This oxide layer has superior adhesion to both polysilicon and silicon nitride films such that the cap bond strength is greater than the cap glass strength. In addition, this oxide layer serves as a protection for the silicon nitride film so as to minimize or avoid over etching from the wafer fabrication process and maintain the robustness of the silicon nitride to block the mobile ions.

The incorporation of the oxide layer enables a high cap bond strength, which is greater than the maximum strength of the cap material, such as glass, and also avoids degradation of the silicon nitride film, providing for robust passivation to mobile ions. The added thin oxide layer makes the fabrication process more robust with minimal extra cost.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
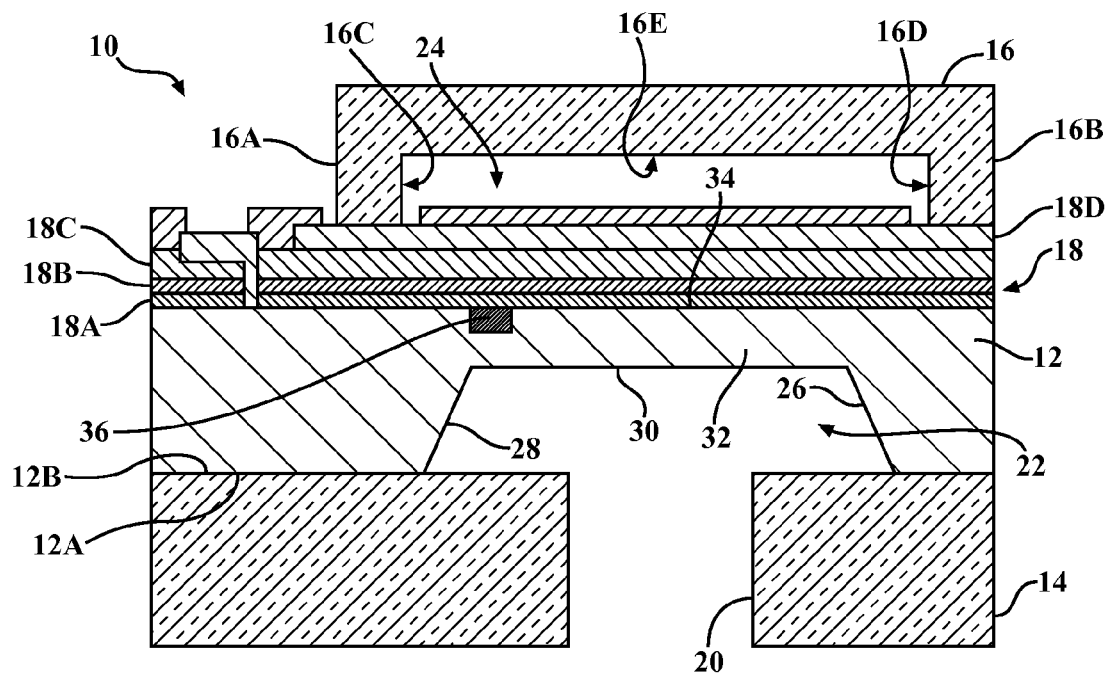
FIG. 1 is a cross-sectional view of a pressure sensor, according to embodiments of the present invention.
Figure 2:
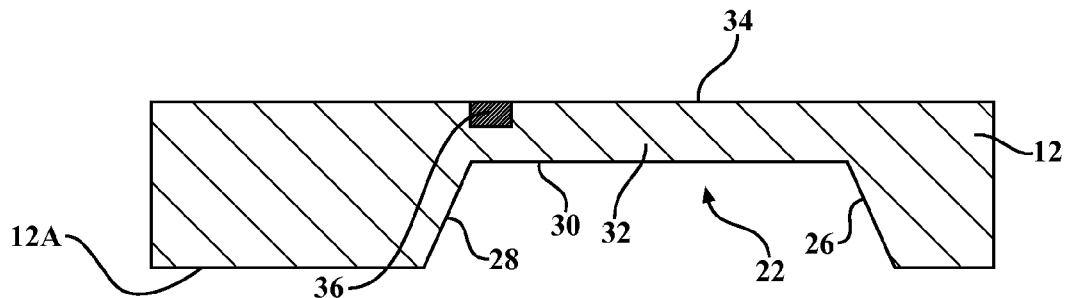
FIG. 2 is a cross-sectional view of a pressure sensing element, which is part of a pressure sensor, according to embodiments of the present invention.
Figure 3:
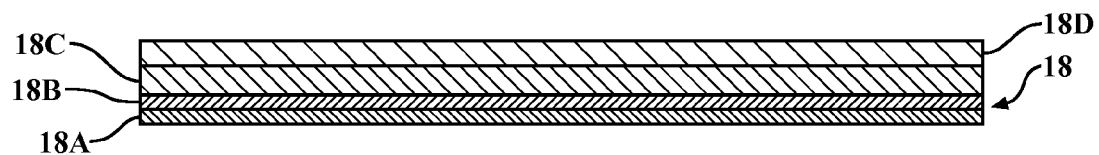
FIG. 3 is a cross-sectional view of a bonding mechanism used as part of a pressure sensor, according to embodiments of the present invention.

An example of the pressure sensor according to the present invention is shown in FIGS. 1-3 generally at 10. The sensor 10 includes a pressure sensing element 12, a glass pedestal 14, a cap 16, and a bonding mechanism, shown generally at 18. Formed as part of the glass pedestal 14 is an aperture 20, and the aperture 20 is in fluid communication with a cavity, shown generally at 22. The pressure sensing element 12 includes a bottom surface 12A which is anodically bonded to a top surface 12B of the glass pedestal 14. In one embodiment, the cap 16 includes sidewalls 16A, 16B, and a second cavity 24 surrounded by inner surfaces 16C, 16D, 16E.

The cavity 22 is etched into the bottom surface 12A of the pressure sensing element 12, and includes four angular inner surfaces, where only a first angular inner surface 26 and a second angular inner surface 28 are depicted in FIGS. 1 and 2, because FIGS. 1 and 2 are cross-sectional views. Each of the four angular inner surfaces terminates into a backside surface 30, which is part of a diaphragm 32. The cap 16 is bonded to the bonding mechanism 18, and the bonding mechanism 18 is bonded to the pressure sensing element 12 in such a way that the second cavity 24 is located over the diaphragm 32 and has at least a partial vacuum.

The pressure sensing element 12 is made from a single crystalline silicon, and includes the diaphragm 32, the cavity 22 having surfaces 26,28,30, and a top surface 34. The top surface of the cavity 22 is also the backside surface 30 of the diaphragm 32. The pressure sensing element 12 also includes bridge circuitry 36 on the top surface 34 in the area of the diaphragm 32. In one embodiment, the bridge circuitry 36 contains at least four separate piezoresistors connected by P+ doped and/or metal interconnects. The piezoresistors may be placed in one of several configurations. The piezoresistors may be located close to one side of the edge of the diaphragm 32, close to four sides of the edge of the diaphragm 32, or distributed in one direction across the diaphragm 32. For drawing simplicity, FIGS. 1 and 2 do not include these details, such as interconnects, or the location of each piezoresistor. Instead, reference numeral 36 in FIGS. 1 and 2 is used to represent a generic bridge circuitry, which may be in any configuration and location as generally known in the field. As mentioned above, the pressure sensing element 12 is anodically bonded to the glass pedestal 14, and to the cap 16 through the bonding mechanism 18, as shown in FIG. 1.

The bonding mechanism 18 is used to bond the cap 16 to the pressure sensing element 12. In some embodiments, the cap 16 may be made of silicon or glass, such as borosilicate glass. In this embodiment, the cap 16 is made of borosilicate glass and is anodically bonded to the bonding mechanism 18 on top of the pressure sensing element 12 to enclose a vacuum or at least partial vacuum the second cavity 24. This allows the pressure sensor 10 shown in FIG. 1 to measure absolute pressure. The length and width of the second cavity 24 are close to or bigger than the length and width of the diaphragm 32.

The bonding mechanism 18 includes several layers used for connecting the cap 16 to the pressure sensing element 12. More specifically, there is a first layer 18A formed on the top surface 34 of the pressure sensing element 12, a second layer 18B deposited on top of the first layer 18A, a third layer 18C deposited on top of the second layer 18B, and a fourth layer 18D deposited on top of the third layer 18C. In this embodiment, the first layer 18A is made of silicon dioxide ($SiO_2$), and is bonded to the pressure sensing element 12. The second layer 18B is Silicon Nitride ($Si_3N_4$), and is bonded to the first layer 18A. The third layer 18C is a layer of oxide, which is deposited the second layer 18B. The fourth layer 18D is a layer of polysilicon, and is bonded to the third layer 18C.

The third layer 18C (the layer of oxide) is about 2.0 μm or less in thickness, but it is within the scope of the invention that other thicknesses may be used. The third layer is an oxide layer deposited by any low temperature (less than 500° C.) process, such as low temperature oxide (LTO), plasma enhanced chemical vapor deposition (PECVD), etc.

The implementation of the third layer 18C provides an improved adhesion to both the $Si_3N_4$ and polysilicon, so as to enhance the bond strength between the cap 16 and the pressure sensing element 12 to be greater than the strength of the material used to make the cap 16 (such as borosilicate glass). The implementation of the third layer 18C also provides a protection for the second layer 18B from over etching by other fabrication steps so that the second layer 18B is not reduced in thickness after being deposited on the first layer 18A, thereby providing a robust passivation function.

The application of the third layer 18C to connect a glass cap, such as the cap 16 to the element 12, is suitable for use in other various applications, such as an accelerometer, a gyroscope, and the like.

In one embodiment, the cavity 22 is formed using an anisotropic chemical etching by potassium hydroxide (KOH), tetramethylammonium hydroxide (TMAH), etc, or a dry etch by deep reactive ion etch (DRIE), but it is within the scope of the invention that other processes may be used.

The diaphragm 32 is relatively thin, and the thickness of the diaphragm 32 depends upon the diaphragm size and the pressure sensing range. The diaphragm 32 deflects in response to pressure applied to the backside surface 30 through the aperture 20 of the substrate 14 and the cavity 22, as shown in FIG. 1. The deflections of the diaphragm 32 resulting from the applied pressure causes an imbalance in the bridge circuitry 36 such that the output of the bridge circuitry 36 correlates to the pressure signal.

The description of the invention is merely exemplary in nature and, thus, variations that do not depart from the gist of the invention are intended to be within the scope of the inven-

What is claimed is:

1. An apparatus, comprising:
a pressure sensor, including:
a pressure sensing element;
a cavity formed as part of the pressure sensing element;
a first layer formed on the to surface of the pressure sensing element;
a second layer deposited on the first layer;
a third layer deposited on the second layer;
a fourth layer deposited on the third layer;
a cap bonded to the fourth layer; and
a diaphragm formed as part of the pressure sensing element, such that at least part of the diaphragm forms part of the cavity;
wherein the width of the fourth layer is greater than the width of the cap.

2. The apparatus of claim 1, the third layer further comprising an oxide layer.

3. The apparatus of claim 2, wherein the first layer is a silicon dioxide layer, the second layer is a silicon nitride layer, and the fourth layer is a polysilicon layer.

4. The apparatus of claim 2, the oxide layer further comprising a thickness of less than 2.0 μm.

5. The apparatus of claim 1, further comprising a second cavity integrally formed as part of the cap such that the second cavity is at least partially evacuated, and the diaphragm is at least partially exposed to the second cavity.

6. The apparatus of claim 1, wherein the cap is made of a borosilicate glass.

7. The apparatus of claim 1, further comprising a bridge circuitry and located on the top side of the diaphragm, the bridge circuitry for detecting a change in pressure in the cavity.

8. A pressure sensor device, comprising:
a pressure sensing element having a diaphragm and a cavity;
at least one glass pedestal that supports the pressure sensing element;
bridge circuitry located on the diaphragm;
a top surface formed as part of the pressure sensing element such that at least a portion of the top surface is part of the diaphragm, the bridge circuitry being located on the top surface;
a backside surface formed as part of the pressure sensing element, the backside surface being part of the diaphragm, and the backside surface being part of the cavity;
a cap bonded to the pressure sensing element;
a first layer formed on the top surface of the pressure sensing element;
a second layer deposited on the first layer;
a third layer deposited on the second layer; and
a fourth layer deposited on the third layer;
wherein the cap is bonded to the fourth layer, and the width of the fourth layer is greater than the width of the cap.

9. The pressure sensor device of claim 8, wherein the first layer is a silicon dioxide layer, the second layer a silicon nitride layer, the third layer an oxide layer, and the fourth layer a polysilicon layer.

10. The pressure sensor device of claim 9, wherein the thickness of the third layer is less than 2.0 μm.

11. The pressure sensor device of claim 8, wherein the bridge circuitry is used for detecting a change in pressure in the cavity.

12. The pressure sensor device of claim 8, wherein a fluid in the cavity applies pressure to the backside surface to deflect the diaphragm, resulting in an output change of the bridge circuitry.

13. The pressure sensor device of claim 8, further comprising a second cavity integrally formed as part of the cap such that the second cavity is at least partially evacuated, and the diaphragm is at least partially exposed to the second cavity.

14. The pressure sensor device of claim 8, wherein the cap is made of a borosilicate glass.

15. A pressure sensor, comprising:
a pressure sensing element having a diaphragm;
a cavity, the cavity being part of the pressure sensing element such that the cavity is located under the diaphragm;
a plurality of piezoresistors connected into bridge circuitry and embedded in the pressure sensing element;
a top surface formed as part of the pressure sensing element such that at least a portion of the top surface is part of the diaphragm, and the bridge circuitry being on the top side of the diaphragm;
a backside surface formed as part of the pressure sensing element, the backside surface being part of the diaphragm;
a plurality of inner surfaces formed as part of the pressure sensing element, the plurality of inner surfaces terminating into the backside surface of the diaphragm such that the plurality of inner surfaces and the backside surface of the diaphragm form at least a portion of the cavity;
a first layer formed on the top surface of the pressure sensing element, the first layer being a silicon dioxide layer;
a second layer deposited on the first layer, the second layer being a silicon nitride layer;
a third layer deposited on the second layer, the third layer being an oxide layer; and
a fourth layer deposited on the third layer, the fourth layer being a polysilicon layer;
a cap, wherein the cap is bonded to the fourth layer, and the width of the fourth layer is greater than the width of the cap.

16. The pressure sensor of claim 15, wherein the thickness of the third layer is less than 2.0 μm.

17. The pressure sensor of claim 15, further comprising a second cavity integrally formed as part of the cap such that the second cavity is at least partially evacuated, and the diaphragm is at least partially exposed to the second cavity.

18. The apparatus of claim 15, wherein the cap is made of a borosilicate glass.

* * * * *